United States Patent [19]

Shimizu

[11] Patent Number: 4,709,386

[45] Date of Patent: Nov. 24, 1987

[54] SUBSCRIBER LINE MONITORING CIRCUIT

[75] Inventor: Toshimitsu Shimizu, Tokyo, Japan

[73] Assignee: NEC Corporation, Japan

[21] Appl. No.: 862,042

[22] Filed: May 12, 1986

[30] Foreign Application Priority Data

May 17, 1985 [JP] Japan .............................. 60-103920

[51] Int. Cl.⁴ ............................................. H04B 3/46
[52] U.S. Cl. ......................................... 379/24; 379/30
[58] Field of Search ........................... 379/22, 24, 30; 324/60 R, 60 C, 60 CD, 111

[56] References Cited

U.S. PATENT DOCUMENTS 4,022,990 5/1977 Bauer .............................. 179/175.3 F
4,186,282 1/1980 Ellson ........................... 179/175.3 R Primary Examiner—Stafford D. Schreyer
Attorney, Agent, or Firm—Laff, Whitesel, Conte & Saret

[57] ABSTRACT

There is disclosed a circuit for monitoring a capacity of a subscriber line to which a capacitor equivalently representative of a telephone set is connected. This monitoring circuit has a test sequence for the subscriber line capacity. The test sequence comprises a first step to connect the subscriber line to a test circuit, and second step to apply a backward voltage to the subscriber line, thereby to discharge an electric charge stored in the equivalent capacitor. The test sequence further comprises a third step to apply a forward voltage to the subscriber line through a reference capacitor, thereby to charge the equivalent capacitor to evaluate the capacity value of the equivalent capacitor on the basis of a voltage appearing across the equivalent capacitor, thus to effect a capacitive test of the subscriber line. Accordingly, where the telephone set includes a diode bridge in an interface of the subscriber line, diodes constituting the diode bridge can become conductive so as to enable the formation of a current charging path at the time of the execution of the third step. Thus, this makes it possible to conduct a capacitive test of not only ordinary telephone set but also telephone sets of the type including the diode bridge in its subscriber line interface.

6 Claims, 11 Drawing Figures

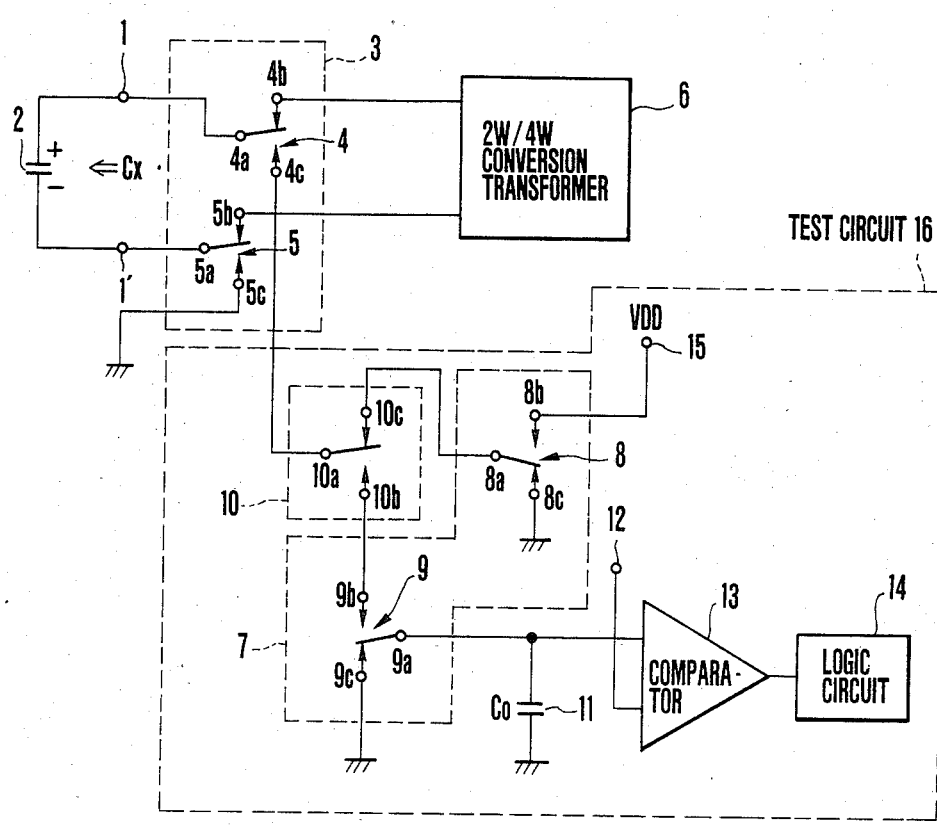
FIG. 1
(PRIOR ART)
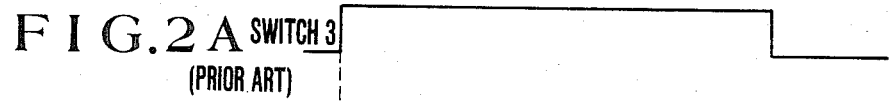
FIG. 2A SWITCH 3
(PRIOR ART)
FIG. 2B RELAY 7
(PRIOR ART)
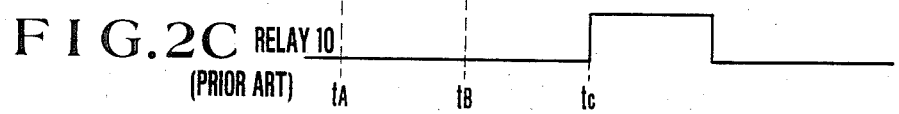
FIG. 2C RELAY 10
(PRIOR ART)

FIG.6A SWITCH 3

FIG.6B RELAY 22

FIG.6C RELAY 25

SUBSCRIBER LINE MONITORING CIRCUIT

BACKGROUND OF THE INVENTION

The present invention relates to a subscriber line monitoring circuit capable of testing subscriber line capacity.

In general, there are many instances where a subscriber line and a telephone set connected to the subscriber line can be equivalently considered as a capacitor alone. The capacity of the equivalent capacitor is referred to the subscriber line capacity. In such a case, a conventional system has adopted the following test sequence for carrying out a test of the subscriber line capacity. Namely, first step is to connect a subscriber line to a test circuit comprising e.g. relay circuitry etc. by means of a suitable switch assembly. Second step is to apply a power supply voltage to the subscriber line from the side of the test circuit to charge the equivalent capacitor. Third step is to form a closed circuit including the equivalent capacitor and a reference capacitor provided in the test circuit to discharge an electric charge stored in the equivalent capacitor into the reference capacitor. In this instance, since the total charge of the both capacitors is constant, a voltage appearing across the equivalent capacitor is determined by the relationship proportional to a voltage-divisional ratio of capacities of the both capacitors and to the power supply voltage. Accordingly, when the values of the power supply voltage and the capacity of the reference capacitor are given, the subscriber line capacity is evaluated based on the voltage appearing across the equivalent capacitor, thus enabling a capacitive test of the subscriber line.

However, such a conventional system cannot be applied to a telephone set including a diode bridge in its subscriber line interface for the reason stated below. Namely, where the above-mentioned test sequence is implemented to such a telephone set, a backward voltage occurs when the third step is executed in order to form the closed circuit. This backward voltage is applied to the diode bridge, failing to form the closed circuit for discharging the electric charge stored in the equivalent capacitor into the reference capacitor. For this reason, the above-mentioned conventional monitoring system cannot be applied to a capacitive test of the subscriber line to which a telephone set including a diode bridge in its interface is connected.

SUMMARY OF THE INVENTION

An object of the present invention is to provide a subscriber line monitoring circuit which makes it possible to securely conduct a capacitive test of not only ordinary telephone sets but also telephone sets of the type including a diode bridge in a circuit interfacing with the subscriber line.

To achieve this object, the present invention provides a circuit for monitoring a capacity of a subscriber line to which a capacitor equivalently representative of a telephone set is connected, the monitoring circuit comprising; a test circuit for measuring the subscriber line capacity, and first means for connecting the subscriber line to the test circuit, the test circuit comprising; second means for applying a voltage to the subscriber line, a reference capacitor connectable in series with the equivalent capacitor, third means for determining the capacity of the subscriber line, whereby after the connection of the subscriber line to the test circuit is established, the second means is first operative to apply a backward voltage to the subscriber line to discharge the equivalent capacitor, thereafter to apply a forward voltage to the subscriber line through the reference capacitor to charge the equivalent capacitor, thereby allowing the third means to measure a voltage appearing across the equivalent capacitor connected to the subscriber line, thus to determine the capacity of the subscriber line.

BRIEF DESCRIPTION OF THE DRAWINGS

The features and advantages of a subscriber line monitoring circuit according to the present invention will become more apparent from the following description taken in conjunction with the accompanying drawings, in which:

FIG. 1 is a block diagram illustrating a conventional subscriber line monitoring circuit, FIGS. 2A to 2C are time charts showing the operations of the switch circuit, and the first and second relays used in the circuit shown in FIG. 1, respectively, FIGS. 6A to 6C are time charts showing the operations of the switch circuit, and the first and second relays used in the circuit shown in FIG. 5, respectively.

DETAILED DESCRIPTION OF THE PREFERRED EMBODIMENT

Figure 3:
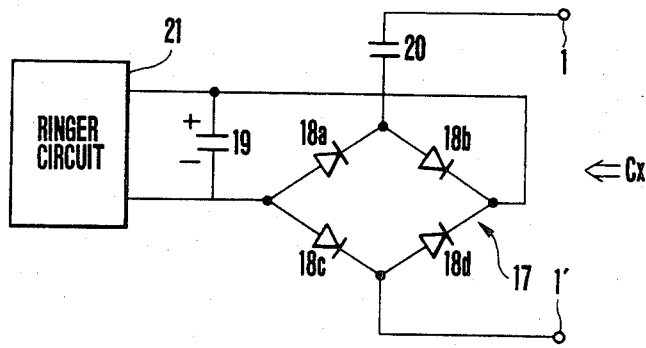
FIG. 3 shows an equivalent circuit diagram of a telephone set including a diode bridge in its subscriber interface.
Figure 4:
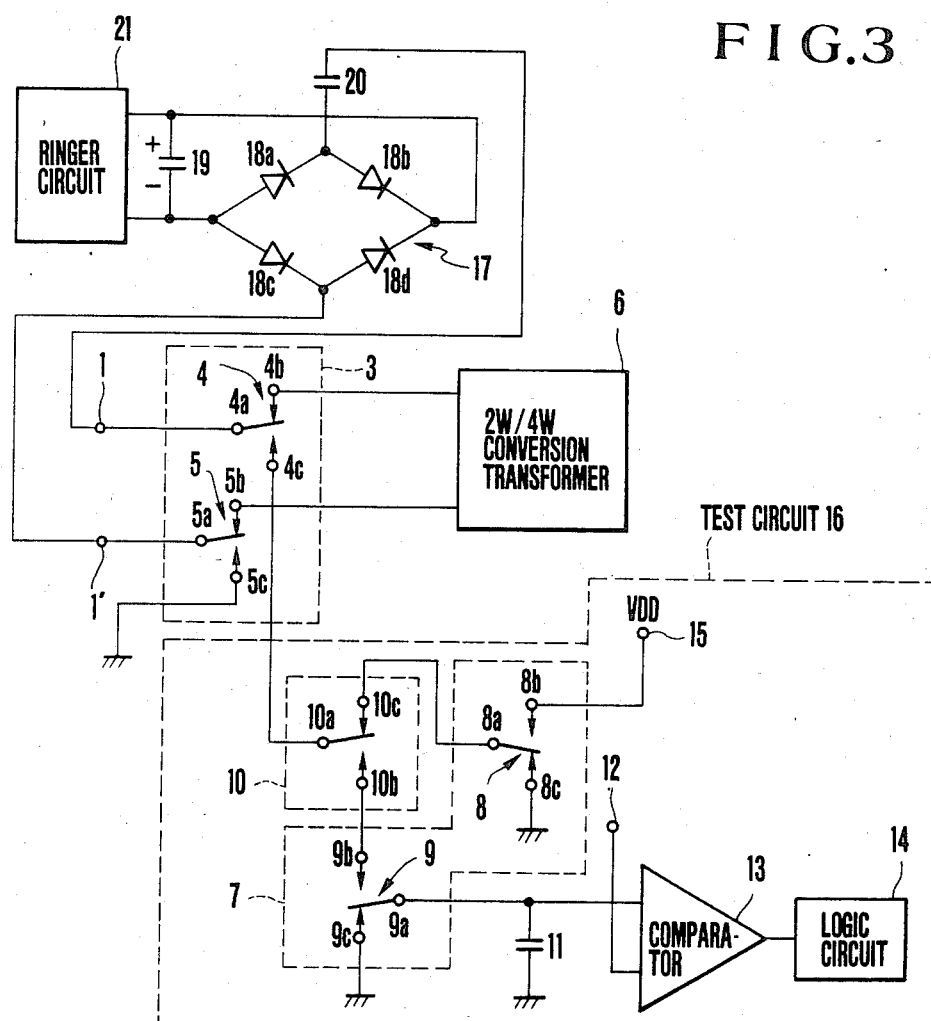
FIG. 4 is a block diagram illustrating a circuit configuration for testing the telephone set shown in FIG. 3 using the test circuit shown in FIG. 1.

For better understanding of the present invention, prior to the description of a preferred embodiment according to the present invention, conventional subscriber line monitoring circuits will be first referred to with reference to FIGS. 1 to 4.

Referring to FIG. 1, there is shown, in a block form, an example of a conventional subscriber line monitoring circuit. This conventional monitoring circuit comprises input terminals 1, 1' to which a subscriber line is connected. A reference numeral 2 designates a capacitor 2 having a subscriber line capacity $C_x$ which is an equivalent capacity including the subscriber line and a telephone set connected to the subscriber line. The input terminals 1, 1' are connected to a switch circuit 3 operative at a timing shown in FIG. 2A to connect the subscriber line to a test circuit 16 to be referred to soon. The switch circuit 3 is provided with a switch 4 comprising a movable contact 4a, and fixed contacts 4b and 4c, and a switch 5 comprising a movable contact 5a and fixed contacts 5b and 5c. To these switches 4 and 5, a 2W(wire)/4W conversion transformer 6 is connected.

The test circuit 16 comprises a relay 7 operative at a timing shown in FIG. 2B, a relay 10 operative at a timing shown in FIG. 2C, a reference capacitor 11 having a capacity $C_o$ connected to the relay 7, a comparator 13 for comparing an input voltage applied through the reference capacitor 11 with a reference voltage applied to a reference voltage terminal 12, and a logic circuit 14 for judging an output of the comparator 13. More particularly, the relay 7 is provided with a transfer contact 8 comprising a common contact 8a, a make contact 8b and a break contact 8c, and a transfer contact 9 comprising a common contact 9a, a make contact 9b and a break contact 9c. The relay 10 comprises a common contact 10a, a make contact 10b and a break contact 10c. A power supply terminal 15 for a power supply voltage $V_{DD}$ is connected to the make contact 8b of the transfer contact 8.

The operation of the above-mentioned conventional subscriber line monitoring circuit will now be described.

Initially, when the switch circuit 3 is switched at the timing shown in FIG. 2A i.e. at time of $t_A$ the movable contact 4a of the switch 4 is in contact with the fixed contact 4c and the movable contact 5a of the switch 5 is in contact with the fixed contact 5c, thus establishing connection of the subscriber line to the test circuit 16. Then, when the relay 7 is energized at the timing shown in FIG. 2B i.e. at time of $t_B$ and is switched thereby, the common contact 8a of the transfer contact 8 is in contact with the make contact 8b and the common contact 9a of the transfer contact 9 is in contact with the make contact 9b. As a result, there is formed a closed circuit including the power supply terminal 15, the make and common contacts 8b and 8a of the transfer contact 8, the break and common contacts 10c and 10a of the relay 10, the fixed and movable contacts 4c and 4a of the first switch 4, the input terminal 1, the capacitor 2, the movable contacts 5a and 5c of the switch 5, and ground connected to the fixed contact 5c. Thus, the capacitor 2 is charged due to the formation of the closed circuit. At this time, since the power supply voltage $V_{DD}$ is applied to the power supply terminal 15, an electric charge expressed as $Qx = Cx \cdot V_{DD}$ is charged in the capacitor 2 having the subscriber line capacity Cx. Then, when the second relay 10 is energized at a timing shown in FIG. 2C i.e. at time of $t_C$ its common contact 10a is in contact with the make contact 10b. As a result, there is formed a closed circuit including ground connected to the contact 5c, the contacts 5c and 5a of the second switch 5, the capacitor 2, the contacts 4a and 4c of the switch 4, the contacts 10a and 10b of the relay 10, the contacts 9b and 9a of the transfer contact 9, the reference capacitor 11, and ground connected thereto. Thus, the electric charge stored in the capacitor 2 is transferred or discharged into the reference capacitor 11 due to the formation of the closed circuit. In this instance, since the total amount of the electric charges of the both capacitors 2 and 11 is invariant, a voltage Vx appearing across the reference capacitor 11 is expressed as $Vx = \{Cx/(Cx+Co)\} \cdot V_{DD}$. Accordingly, by setting in advance the power supply voltage $V_{DD}$ and the capacity Co of the reference capacitor 11 to predetermined values, respectively, it is possible to evaluate the capacity Cx of the capacitor 2 on the basis of the above relationship relating to the voltage Vx. Thus, a desired test result of the subscriber line can be obtained from a compared result output from the comparator 13.

In general, various kinds of telephone sets are connectable to the subscriber line to be tested by the monitoring circuits of this kind. In the case where a telephone set connected to the subscriber line can be equivalently considered as a capacitor alone as in the case stated above, the condition of the subscriber line capacity Cx can be tested as shown in FIG. 1. However, it is unable to test the subscriber line capacity using the monitoring circuit shown in FIG. 1 in case of a telephone set as shown in FIG. 3 including a diode bridge in its subscriber line interface. The reason why such a circuit cannot be applied to the telephone set including the diode bridge will be explained with reference to FIG. 4. In this figure, there is illustrated, in a block form, an example of a conventional subscriber monitoring circuit wherein the telephone set shown in FIG. 3 is connected to the test circuit 16 shown in FIG. 1. The telephone set in this example includes a diode bridge 17 comprising diodes 18a to 18d, a capacitor 19 having a capacity $C_A$, a capacitor 20 having a capacity $C_B$ of the subscriber line, and a ringer circuit 21. The setting is made such that the capacity $C_A$ of the capacitor 19 is extremely larger than the capacity $C_B$ of the capacitor 20. The operation of this circuit will now be described. Initially, when the switch circuit 3 is switched at the timing shown in FIG. 2A i.e. at time of $t_A$ the contact 4a of the switch 4 is in contact with the contact 4c and the contact 5a of the switch 5 is in contact with the contact 5c, thus establishing the connection of the subscriber line to the test circuit 16. Then, when the relay 7 is energized at the timing shown in FIG. 2B i.e. at time of $t_B$ and is switched thereby, the contact 8a of the transfer contact 8 is in contact with the contact 8b and the contact 9a of the transfer contact 9 is in contact with the contact 9b. As a result, there is formed a closed circuit including the power supply terminal 15, the contacts 8b and 8a of the transfer contact 8, the contacts 10c and 10a of the relay 10, the contacts 4c and 4a of the switch 4, the subscriber line, the capacitor 20, the diode 18b, the capacitor 19, the diode 18c, the contacts 5a and 5c of the switch 5, and ground connected to the contact 5c. Thus, an electric charge is stored in the capacitors 19 and 20 due to the formation of the closed circuit. Then, when the relay 10 is energized at the timing shown in FIG. 2C i.e. at time of $t_C$ its contact 10a is in contact with the contact 10b. In this instance, since a backward voltage is applied to the diode bridge 17, the diode bridge 17 does not become conductive, resulting in no path for allowing the electric charges stored in the capacitors 19 and 20 to be discharged. Namely, these electric charges are not discharged into the reference capacitor 11. Accordingly, it is unable to test a telephone set including a diode bridge in its subscriber interface with the conventional test circuit.

The present invention has been made with a view to solving this problem and its preferred embodiment will be described in detail.

Figure 5:
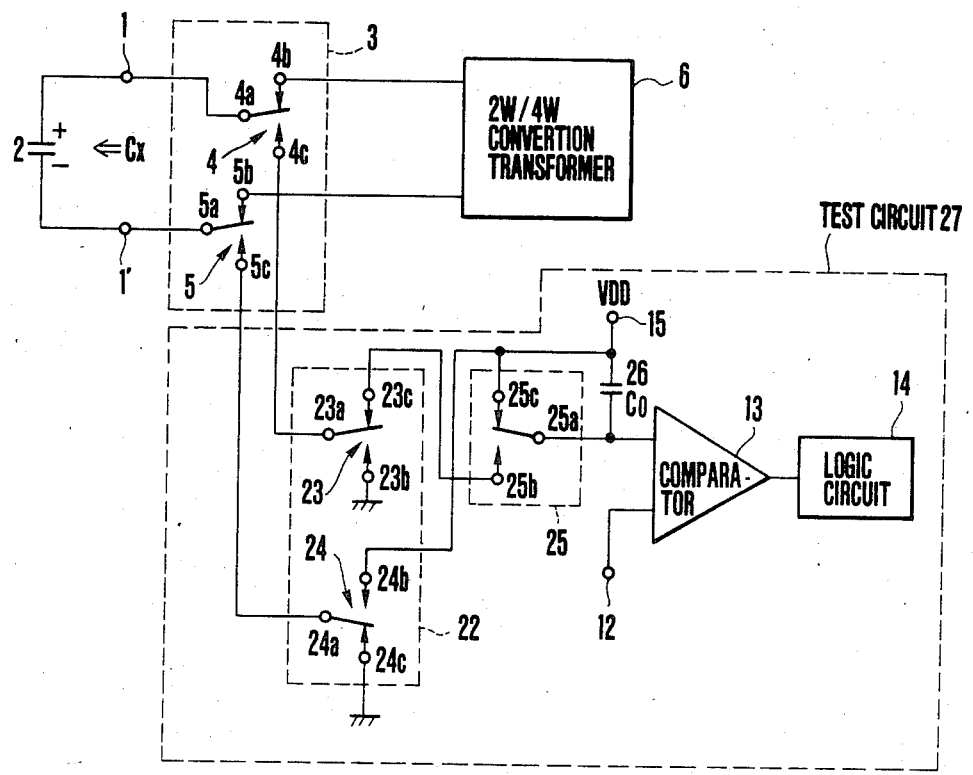
FIG. 5 is a block diagram illustrating an embodiment of a subscriber line monitoring circuit according to the present invention.

Initially, referring to FIG. 5, there is shown, in a block form, an embodiment of a subscriber line monitoring circuit according to the present invention wherein parts identical to those in FIG. 1 are designated by the same reference numerals, respectively, and therefore their explanation will be omitted. A test circuit represented by reference numeral 27 comprises a relay 22 operative at a timing shown in FIG. 6B, a relay 25 connected to the output side of the relay 22 and operative at a timing shown in FIG. 6C, the comparator 13 for comparing an output of the relay 25 with a reference voltage applied to the reference voltage terminal 12, and the logic circuit 14 for judging an output indicative of a compared result of the comparator 13. More particularly, the relay 22 is provided with a transfer contact 23 comprising a common contact 23a connected to the fixed contact 4c of the switch 4 provided in the switch circuit 3, a make contact 23b connected to ground, and a break contact 23c, and a transfer contact 24 comprising a common contact 24a connected to the fixed contact 5c of the switch 5 provided in the switch circuit 3, a make contact 24b connected to the power supply terminal 15, and a break contact 24c connected to ground. Further, the relay 25 comprises a common contact 25a connected to one input terminal of the comparator 13, a make contact 25b connected to the break contact 23c of the transfer contact 23 provided in the relay 22, and a break contact 25c connected to the power supply terminal 15. In addition, the comparator 13 is provided with a reference capacitor 26 having a capacity Co wherein the reference capacitor 26 has one electrode connected to the power supply terminal 15 and the other electrode connected to the common contact 25a of the relay 25.

The operation of the subscriber line monitoring circuit thus configured will now be described. In the initial condition, an electric charge is not stored in the reference capacitor 26 because it is short-circuited by the common and break contacts 25a and 25c of the relay 25. Then, when the switch circuit 3 is switched at the timing shown in FIG. 6A i.e. at time of $t_A$, the movable contact 4a of the switch 4 is in contact with the fixed contact 4c and the movable contact 5a of the switch 5 is in contact with the fixed contact 5c thereof, thus establishing the connection of the subscriber line to the test circuit 27. Then, when the relay 22 is energized at the timing shown in FIG. 6B i.e. at time of $t'_B$ and is switched thereby, the common contact 23a of the transfer contact 23 is in contact with the make contact 23b, and the common contact 24a of the transfer contact 24 is in contact with the make contact 24b. As a result, there is formed a closed circuit including ground connected to the make contact 23b, the make and common contacts 23b and 23a of the first transfer contact 23 provided in the relay 22, the fixed and movable contacts 4c and 4a of the switch 4 provided in the switch circuit 3, the input terminal 1, the capacitor 2, the movable and fixed contacts 5a and 5c of the switch 5 provided in the switch circuit 3, the common and make contacts 24a and 24b of the transfer contact 24 provided in the first relay 22, and the power supply terminal 15. Thus, a backward voltage is applied to the subscriber line due to the formation of the closed circuit, with the result that the capacitor 2 is discharged. Then, when the relay 25 is energized at the timing shown in FIG. 6C i.e. at time of $t'_C$ its common contact 25a is in contact with the make contact 25b. As a result, there is formed a closed circuit including the power supply terminal 15, the reference capacitor 26, the common and make contacts 25a and 25b of the second relay 25, the break and common contacts 23c and 23a of the transfer contact 23, the fixed and movable contacts 4c and 4a of the switch 4, input terminal 1, the capacitor 2, the movable and fixed contacts 5a and 5c of the switch 5, the common and break contacts 24a and 24c of the transfer contact 24, and ground connected to the break contact 24c. Thus, the capacitor 2 having the capacity Cx is charged due to the formation of the closed circuit. Accordingly, the power supply voltage $V_{DD}$ applied to the power supply terminal 15 is voltage-divided by the reference capacitor 26 and the capacitor 2. As a result, a voltage Vx appearing across the capacitor 2 having the capacity Cx is expressed as follows:

$$Vx = \{1/(Co+Cx)\} \cdot Co \cdot V_{DD}.$$

Accordingly, by setting in advance the reference voltage applied to the reference voltage terminal 12 and the reference capacitor 26 to predetermined values, respectively, it is possible to evaluate the subscriber line capacity Cx on the basis of the relationship relating to the voltage Vx. Thus, by inputting an output of the comparator 13 to the logic circuit 14, a test result can be obtained.

Figure 7:
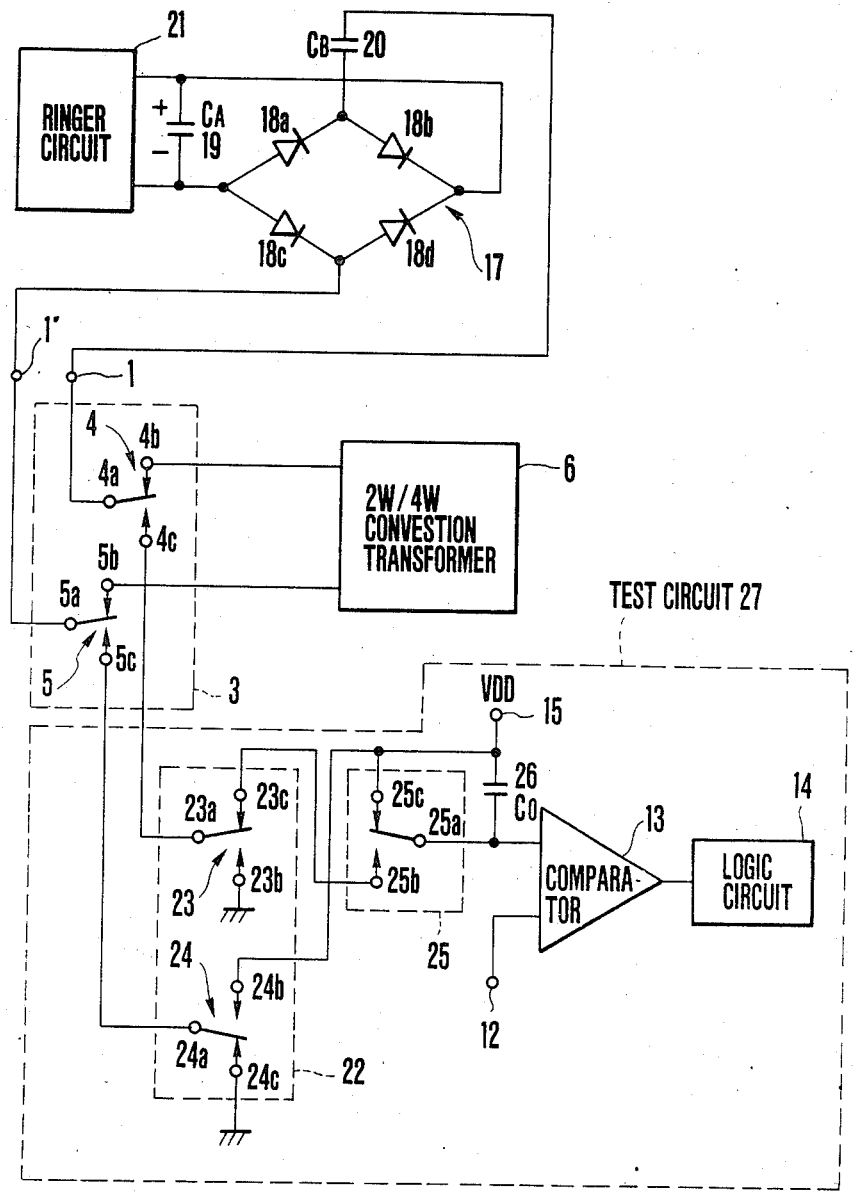
FIG. 7 is a block diagram illustrating a circuit configuration for testing a telephone set including a diode bridge in its subscriber line interface using a test circuit shown in FIG. 5.

FIG. 7 is a block diagram illustrating a circuit configuration for testing the telephone set including a diode bridge in its subscriber line interface shown in FIG. 3 using the test circuit 27 shown in FIG. 5.

Initially, when the switch circuit 3 is switched at the timing showing in FIG. 6A i.e. at time of $t'_A$ the movable contact 4a of the switch 4 is in contact with the fixed contact 4c and the movable contact 5a of the switch 5 is in contact with the fixed contact 5c, thus establishing connection of the subscriber line to the test circuit 27. Then, when the relay 22 is energized at the timing shown in FIG. 6B i.e. at time of $t'_B$ and is switched thereby, the common contact 23a of the transfer contact 23 is in contact with the make contact 23b, and the common contact 24a of the transfer contact 24 is in contact with the make contact 24b. Thus, there is formed a closed circuit including the power supply terminal 15, the make and common contacts 24b and 24a of the transfer contact 24, the fixed and movable contacts 5c and 5a of the second switch 5, the subscriber line, the diode 18d of the diode bridge 17, the capacitor 19, the diode 18a of the diode bridge 17, the capacitor 20 of the subscriber line, the subscriber line, the movable and fixed contacts 4a and 4c of the switch 4, the common and make contacts 23a and 23b of the transfer contact 23, and ground connected to the make contact 23b. As a result, as previously described, a backward voltage is applied to the capacitors 19 and 20 due to the formation of the closed circuit, with the result that there occurs the same condition as the condition where electric charges stored on the capacitors 19 and 20 have been discharged. Then, when the relay 25 is energized at a timing shown in FIG. 6C, its common contact 25a is in contact with the make contact 25b. As a result, there is formed a closed circuit including the power supply terminal 15, the reference capacitor 26, the common and make contacts 25a and 25b of the relay 25, the break and common contacts 23c and 23a of the transfer contact 23, the fixed and movable contacts 4c and 4a of the switch 4, the subscriber line, the capacitor 20, the diode 18b of the diode bridge 17, the capacitor 19, the diode 18c of the diode bridge 17, the subscriber line, the movable and fixed contacts 5a and 5c of the switch 5, the common and break contacts 24a and 24c of the transfer contact 24, and ground connected to the break contact 24c. Thus, the capacitor 19 having the capacity $C_A$ and the capacitor 20 having the capacity $C_B$ are charged due to the formation of the above-mentioned closed circuit. In this instance, since the capacity $C_A$ of the capacitor 19 is extremely larger than the capacit $C_B$ of the capacitor 20, the power supply voltage $V_{DD}$ is voltage-divided by the reference capacitor 26 and the capacitor 19 in the same manner as in the case shown in FIG. 1. As a result, a voltage Vx appearing across the subscriber line 1 is expressed as follows.

$$Vx = \{1/(Co+C_A)\} \cdot Co \cdot V_{DD}.$$

Accordingly, by setting in advance the reference voltage applied to the reference voltage terminal 12 and the reference capacitor 26 to predetermined values, respectively, it is possible to evaluate a capacity connected to the subscriber line on the basis of the relationship relating to the voltage Vx. By inputting an output of the comparator 13 to the logic circuit 14, a test result can be obtained.

As described in detail, the subscriber line monitoring circuit according to the present invention is configured to apply a backward voltage with respect to a voltage charged in the subscriber line, thereby discharging an electric charge stored in the subscriber line, thereafter to charge it. Accordingly, this novel subscriber line monitoring circuit can securely make a capacitive test of not only ordinary telephone sets but also telephone sets including a diode bridge in a circuit interfacing with the subscriber line.

What is claimed is:

1. A circuit for monitoring a capacity of a subscriber line to which a capacitor equivalently representative of a telephone set is connected, said monitoring circuit comprising;

a test circuit for measuring said subscriber line capacity, and first means operative to connect said subscriber line to said test circuit, said test circuit comprising;

second means for applying a voltage to said subscriber line, a reference capacitor connectable in series with said equivalent capacitor, third means for determining the capacity of said subscriber line, whereby after the connection of said subscriber line to said test circuit is established, said second means is first operative to apply a backward voltage to said subscriber line to discharge said equivalent capacitor, thereafter to apply a forward voltage to said subscriber line through said reference capacitor to charge said equivalent capacitor, thereby allowing said third means to measure a voltage appearing across said equivalent capacitor connected to said subscriber line, thus to determine said capacity of said subscriber line.

2. A monitoring circuit as set forth in claim 1, wherein said first means comprises a switch circuit.

3. A monitoring circuit as set forth in claim 1, wherein said second means comprises two sets of relays for applying backward and forward voltages to said subscriber line, respectively.

4. A monitoring circuit as set forth in claim 1, wherein said third means comprises a comparator for comparing a voltage applied to said reference capacitor with a predetermined reference voltage, and a logic circuit responsive to an output of said comparator to determine the subscriber line capacity.

5. A monitoring circuit as set forth in claim 1, wherein said telephone set includes a diode bridge in an interface of said subscriber line.

6. A monitoring circuit as set forth in claim 5, wherein said diode bridge is connected to said equivalent capacitor so that diode constituting said diode bridge become conductive so as to enable the formation of a closed circuiut for applying a forward voltage to said subscriber line.

* * * * *